(12) United States Patent
Hansson et al.

(10) Patent No.: US 7,504,787 B2
(45) Date of Patent: Mar. 17, 2009

(54) CAPACITIVE SQUEEZE PROTECTING DEVICE

(75) Inventors: Goran Hansson, Gronstensvagen 10, Uppsala, S-752 41 (SE); Bo Lindgren, Varmdo (SE); Stig Norberg, Jarfalla (SE)

(73) Assignee: Goran Hansson, Uppsala (SE)

( * ) Notice: Subject to any disclaimer, the term of this patent is extended or adjusted under 35 U.S.C. 154(b) by 504 days.

(21) Appl. No.: 10/527,394

(22) PCT Filed: Sep. 12, 2003

(86) PCT No.: PCT/SE03/01421

§ 371 (c)(1), (2), (4) Date: Dec. 5, 2005

(87) PCT Pub. No.: WO2004/025062

PCT Pub. Date: Mar. 25, 2004

(65) Prior Publication Data

US 2006/0117661 A1   Jun. 8, 2006

(30) Foreign Application Priority Data

Sep. 12, 2002   (SE) .................................. 0202715

(51) Int. Cl.
*E05F 15/14* (2006.01)
(52) U.S. Cl. ............................ 318/266; 324/686; 49/26
(58) Field of Classification Search ......... 318/264–266, 318/280, 286, 434, 466–470, 480; 388/903, 388/933; 307/116; 324/674, 686; 49/26, 49/31

See application file for complete search history.

(56) References Cited

U.S. PATENT DOCUMENTS

| 3,829,850 | A | * | 8/1974 | Guetersloh | 340/515 |
| 3,845,843 | A | * | 11/1974 | Cohen | 187/317 |
| 4,191,894 | A | * | 3/1980 | Noda et al. | 307/116 |
| 4,208,695 | A | * | 6/1980 | Noda et al. | 361/181 |
| 4,453,112 | A | * | 6/1984 | Sauer et al. | 318/281 |
| 5,027,552 | A |   | 7/1991 | Miller et al. | |
| 5,796,183 | A | * | 8/1998 | Hourmand | 307/116 |
| 6,518,776 | B2 | * | 2/2003 | Charneau et al. | 324/662 |

FOREIGN PATENT DOCUMENTS

| EP | 0 191 137 | 8/1986 |
| EP | 1 154 110 | 11/2001 |
| GB | 2 177 216 | 1/1987 |
| WO | 01/06652 | 1/2001 |

* cited by examiner

*Primary Examiner*—Bentsu Ro
(74) *Attorney, Agent, or Firm*—Pearne & Gordon LLP

(57) ABSTRACT

A capacitive squeeze protecting device having a high degree of security and flexibility for automatic doors. The squeeze protecting device is arranged to detect the presence of an object in a protection field comprising a housing and an antenna unit connected to a detecting circuit, which circuit is arranged to, via said antenna unit, detect capacitive variations in an electric or electromagnetic field at said antenna unit. The detecting circuit comprises means connected to said antenna unit arranged to detect a variation of the pressure at said antenna unit caused by a compressive force applied at said housing, wherein the presence of conductive as well as non-conductive object can be detected. Furthermore, the invention includes a system and methods for detecting for detecting the presence of an object in a protection field at a door.

22 Claims, 10 Drawing Sheets

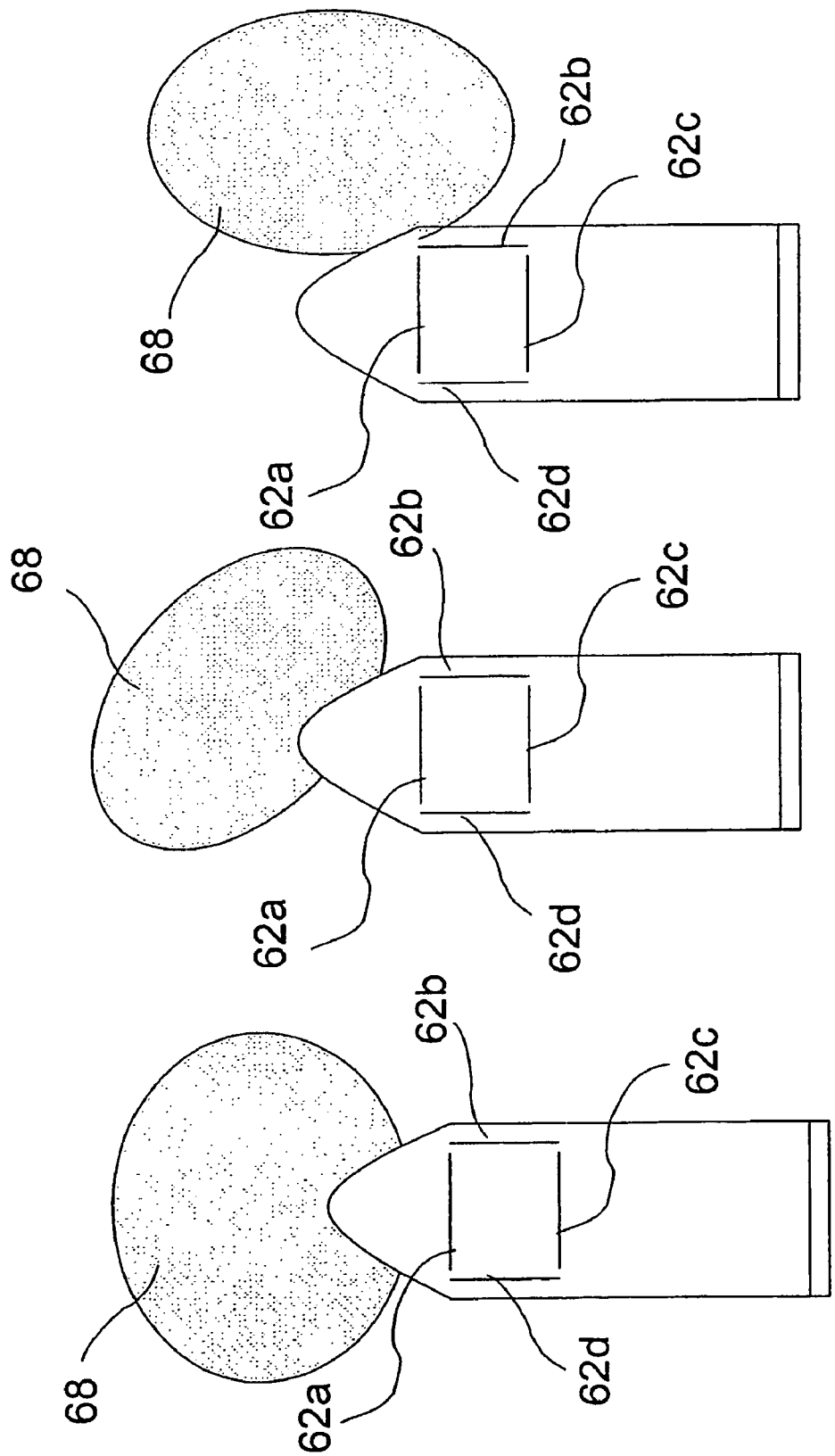

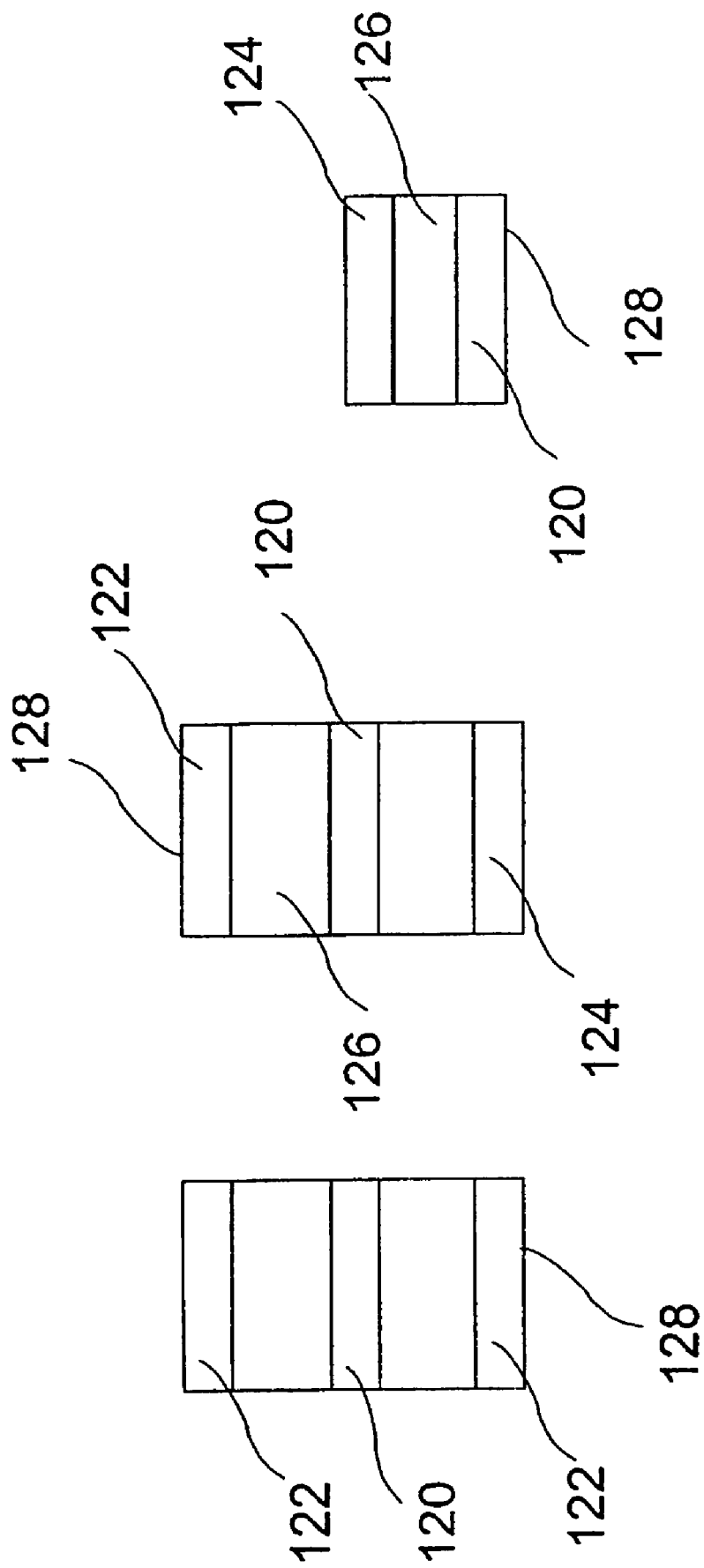

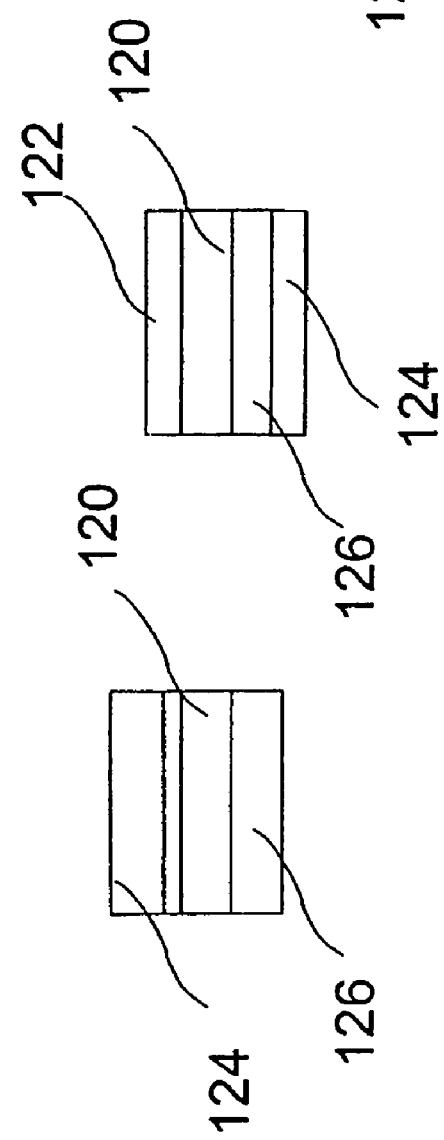

CAPACITIVE SQUEEZE PROTECTING DEVICE

This application claims the benefit of International Application Number PCT/SE2003/001421, which was published in English on Mar. 25, 2004.

TECHNICAL FIELD

The present invention relates to a capacitive squeeze protecting device with a high security level and flexibility for use in automatic doors.

STATE OF THE ART

Automatically controlled doors and are used in a variety of locations, such as entrances, indoor passages, busses/underground trains/trains, garages, industrial plants, warehouses and elevators. Other applications lying near at hand is different types of lifts and shutters or hatchers and furniture's, for example, mechanically driven beds and armchairs. In the context of this application all of these will henceforth be denoted as doors.

There exist a number of different types of automatic doors, for example, doors describing a circular movement (a movement of 360 degrees) and rotating doors and traditional doors that often describes a movement of 90 or 180 degrees. There is also doors moving linearly, for example, sliding doors and folding doors. Other doors move in principle around an shaft, for example, balance doors. Yet another type of door combines different types of movement patterns, for example, the linear movement and a final circular or vertical movement. A large group is roof mounted sliding doors and fast roller doors, which often have a significant impact of the power consumption due to its size.

A higher opening speed/closing speed is highly desirable in, above all, an energy-saving point of view. However, this come into conflict with the requirements of a increased stopping distance and security. It is difficult to increase the speed using conventional contact rails without sidestepping statutory requirements regarding compressive force.

In this connection it should be noted that at a speed of 1 m/s of the door and a reaction time of the electronics of 100 ms from that the contact rail emits a signal, the stopping distance will be approximately 10 cm. Accordingly, if the speed is doubled, i.e. 2 m/s, the reaction time will be approximately 20 cm.

Automatically controlled doors can cause personal injuries of different kinds, for example, the door blades of rotating doors can, which due to reasons of comfort have a certain rotational speed which, in turn, give rise to a certain stopping distance and a significant kinetic energy, push passing people over before the door has stopped with attendant falling injuries. One critical area is the distance between the moving door blade and the stationary stand or door post. If an object is present in that area and the contact rails of the door responds to direct mechanical contact, the door blade will collide with a person before it stops and, possibly, reverses.

In many cases sliding doors of busses and underground trains pushed people over, which in certain cases have resulted in that the person has been ran over.

In order to prevent such accidents from occurring sensors are used to sense or detect whether a person is too close to the doors when they are closing and thereby run the risk of being squeezed and/or pushed over. There are number of different types of sensors used for this purpose, for example, electric/mechanical contact rails, pneumatic/hydraulic contact rails, volume sensors, line light sensors and capacitive sensors.

The most commonly used sensor principle for contact rails in automatic doors is open electric circuits, which often is in-built in soft plastic or rubber. An open electric circuit be composed of two contact sheets of metal or conductive rubber arranged in parallel. When a pressure is applied on the rail, the two contact sheets will contact each other and the circuit is closed. For example, in U.S. Pat. Nos. 5,964,058 and 5,438,798 examples of such devices are shown. In U.S. Pat. No. 5,027,552 a system with electric conductors for contacting in combination with a capacitive conductor for range-finding is disclosed. One problem with the device disclosed in U.S. Pat. No. 5,027,552 is that the capacitive conductor is influenced by the electric conductors and of adjacent ground planes in the door. Another problem is that it may arise condensation in the space within the housing where the conductors are arranged, which may cause, for example, corrosion. A common problem with contact sheets or with electric conductors of the above mentioned type is that the direction of the compressive force must have a predetermined angle of, for example, 90 degrees, in order to press the contact sheets together. Furthermore, the contact sheets will be deformed by powerful damage as they usually are made of metal, which may give rise to functional problem. Finally, there is a risk that gravel, dust, rubber parts or other non-conducting particles may land between the contacts sheets and thereby prevent contact between them.

Another common sensor principle is closed electric circuits. A closed electric circuit may consist of a conductor, which, in turn, consists of a number of smaller conductors kept together by a resilient device. When a pressure is directed to the conductor it will urge apart and the circuit will be broken. In U.S. Pat. No. 6,396,010 such a breaking electric circuit is disclosed. However, the circuit in U.S. Pat. No. 6,396,010 has a very complex construction comprising precision manufactured metal sheets. Another solution is disclosed in EP 0234523, where a breaking circuit is formed by plastic balls and an inner metal conductor with contact sheets. Also this device a complex construction.

Another common sensor type is pneumatic/hydraulic contact rails using, for example, contact sheets in which compressed-air apparatus comprising a hermetically closed tube, conventionally in-built in rubber or soft plastic, I combination with a compressed-air sensor, which upon a predetermined pressure obtained when the tube is compressed, registers and triggers a safety operation, for example, stopping the doors. To use air as a sensor is associated with significant drawbacks due to the fact the air is inherently sensitive for temperature variations. Since the contact rails is placed at doorposts they often are exposed for large temperature variations at opening/closing of the doors, which has a significant negative impact of the reliability of the rails. Devices that utilizes liquids is also used to a certain extent but since liquids also are influenced by temperature variations, these devices suffer from the same problem. Moreover, pneumatic/hydraulic devices are affected by mechanical damage. In U.S. Pat. No. 4,133,365 a device using pneumatic edge detecting of double doors is disclosed.

In other devices fibre optic that responds to pressure are used. Fibre optic has a much higher durability against disturbances such as temperature differences, but is sensitive to mechanical damage, which is common at doorways.

Another type of sensors are so called non-contact sensors, for example, volume sensors, line-light sensors, and capacitive sensors. Volume sensors are mainly constituted of sensors for ultra light and infrared light. In both cases there are significant difficulties in limiting and directing the target area so that false detection do not occurred. In vehicles, for example, busses and underground trains, where the body can be curved and in which doors and bodies moves considerably during the transportation, volume sensors are not practical applicable. The same applies to line sensors in which optical light rays are used, which rays are sensitive to movements of the point of attachment. In U.S. Pat. No. 4,621,452 and PCT/SE87/00405 such sensor systems are described. Capacitive sensors solve many of the above mentioned problem but they can only detect conductive objects. Such systems are described in, for example, DE 3521004, U.S. Pat. Nos. 3,370,677 and 4,976, 337.

All of the above described sensor systems are not construed to prevent people and object from being pushed and/or squeezed between doors or between a door and a door post. Due to the design of the sensors the requirement of that all of the door edge should be sensing. This is especially important at the lower part of the edge of the door where a foot or a hand may be stuck.

BRIEF DESCRIPTION OF THE INVENTION

The object of the present invention is to provide a capacitive squeeze protecting device for ports and doors, and in particular for automatic doors, which is able to simultaneously detect physical pressure of conductive as well as non-conductive object and persons or conductive objects within a protection or measurement field generated by an antenna. By careful measurements using a capacitive detector the distance to a foreign conductive object or person can be measured. The capacitive detector fulfils the requirements of EMC and is capable of generating a balanced field that surrounds the antenna and that is not affected by variations in moisture or temperature so as to detect small capacitive variations of the generated filled that surrounds the antenna. The compressive force applied on the squeeze protecting device can also be indicated accurately. This and other objects are achieved according to the present invention by a squeeze protecting device, system and method having the features defined in the independent claims. Preferred embodiments are defined in the dependent claims.

A squeeze protecting device according to a first aspect of the invention comprises a housing and an antenna unit connected to a detecting circuit, which circuit is arranged to detect capacitive variations, via said antenna unit, in an electric or electromagnetic field around said antenna unit. Furthermore, the detecting unit comprises means connected to said antenna unit arranged to detect a variation of the pressure at said antenna unit caused by a compressive force applied at said housing, wherein the presence of conductive as well non-conductive objects in said protection field can be detected.

A squeeze protecting device according to a second aspect of the present invention comprises a housing and an antenna unit connected to a detecting circuit, which circuit is arranged to detect capacitive variations, via said antenna unit, in an electric or electromagnetic field around said antenna unit. The antenna unit comprises a plurality of conductive elements connected to said detecting circuit and said detecting circuit comprises means connected to said antenna unit arranged to detect a compressive force applied to said housing as a variation of the distance between a first and a second conductive element of the antenna unit, wherein the presence of conductive as well as non-conductive object in said protection field can be detected.

BRIEF DESCRIPTION OF THE DRAWINGS

Above-mentioned and other features and advantages of the present invention will be apparent from the following detailed description of preferred embodiments, merely exemplifying, in conjunction with the attached drawing, wherein:

FIGS. 6a-c show in cross-section how the measurement field generated at the rail shown in FIGS. 4 and 5 can be directed in different directions;

FIG. 9a shows a fourth embodiment of a contact rail with squeeze protection according to the present invention;

FIG. 9b shows in cross section a fifth embodiment of a contact rail provided with squeeze protection according to the present invention;

FIG. 9c shows in cross section a sixth embodiment of a contact rail provided with squeeze protection according to the present invention;

FIG. 9d shows in cross section a seventh embodiment of a contact rail provided with squeeze protection according to the present invention;

FIG. 9e shows in cross section a eighth embodiment of a contact rail provided with squeeze protection according to the present invention;

FIG. 9f shows in cross section a ninth embodiment of a contact rail provided with squeeze protection according to the present invention;

DESCRIPTION OF PREFERRED EMBODIMENTS

Figure 1:
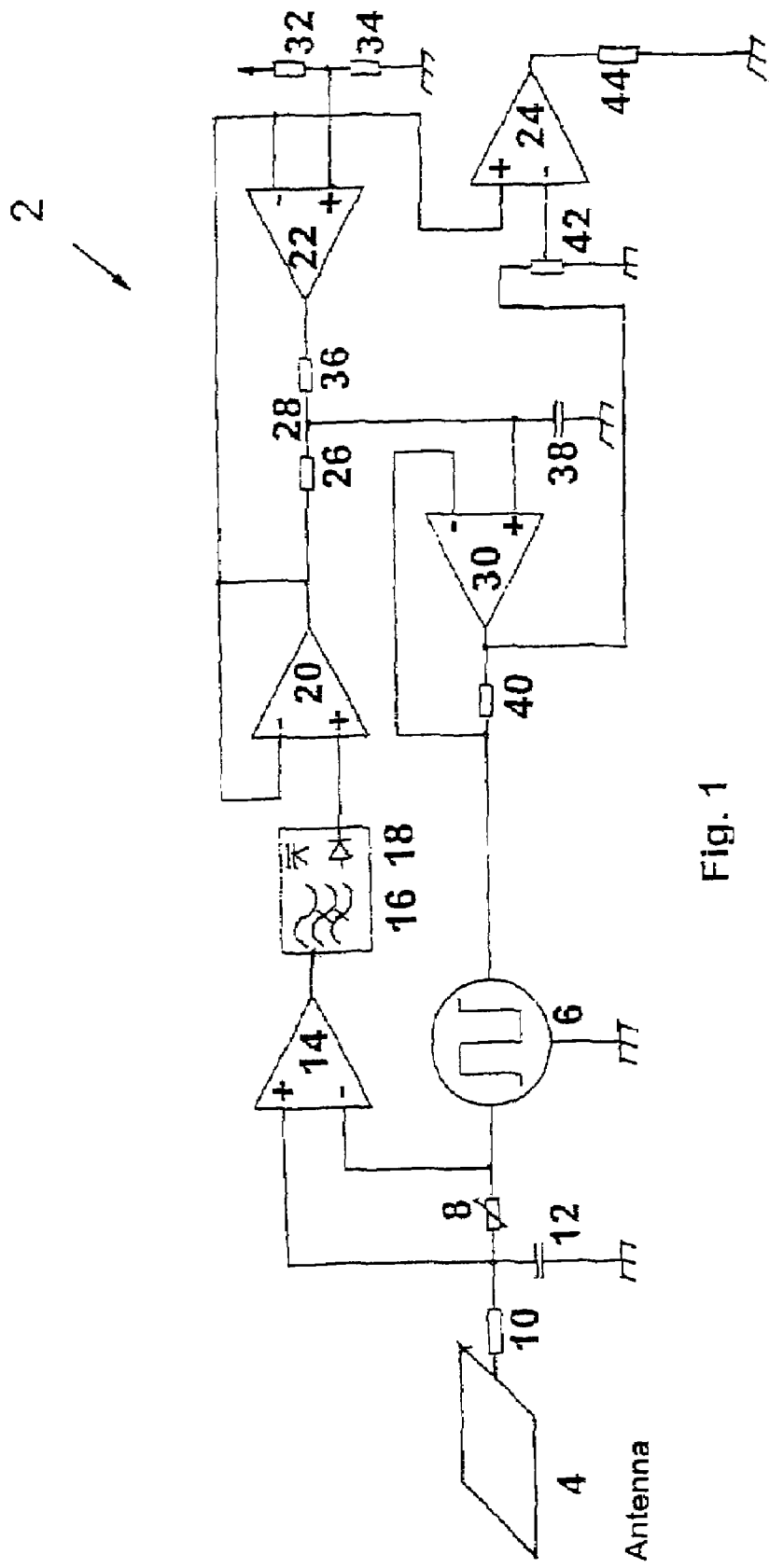
FIG. 1 is a circuit diagram according to first embodiment having an analogous capacitive detecting circuit.

With reference first to FIG. 1, an electric circuit 2 and an antenna 4 constituting a preferred embodiment of a capacitive detecting coupling which may well be used in the present invention.

The electronic circuit 2 has a square wave generator 6 having an output connected to ground and a second output connected to an adjustable resistor 8. The second output is also connected to the negative input of an operational amplifier 14. The other end of the adjustable resistor is connected to a low-pass filter comprising a resistor 10 and a capacitor 12 and to the positive input of operational amplifier 14. Capacitor 12 included in low-pass filer is connected to ground and resistor 10 is connected to antenna 4. The output of operational amplifier 14 is, via a high-pass filer 16 and a peak value rectifier 18, connected to the positive input of a operational amplifier used as a voltage follower 20. The output of voltage follower 20 is used as a feed-back for the negative output thereof. The output of voltage follower 20 is also connected to the negative input of a comparator 22, the positive input of a comparator 24 and via a resistor 26 and a summing node 28 to the positive input of a voltage follower 30. The positive input of comparator 22 is fed by a voltage reference from a voltage divider comprising two resistors 32 and 34. Resistor 32 is connected to a positive feed voltage and resistor 34 is connected to ground. The output of comparator 22 is, via resistor 36 and summing node 28, connected to the positive output of voltage follower 30. Summing node 28 is connected to ground via capacitor 38. The output of voltage follower 30 is, via a resistor 40 used as a feed-back, connected to the negative output thereof. This output is also, via resistor 40, used as a input to square wave generator 6, thereby closing the loop. The direct output of voltage follower 30 is via a potential meter 42 used as a negative input to comparator 24 the output of comparator 24 is connected to ground via a resistor 44.

Thus, the physical construction of the capacitive detector has been described and the description will now be concentrated on the function of the different elements in the electronic circuit 2, which constitutes the capacitive detector.

The configuration of the antenna 4 can be varied in a number of different ways depending on the application of the capacitive detector.

Square wave generator 6, whose output level is adjustable, generates a square wave, 50-5000 Hz, which is applied to the antenna 4 via the adjustable resistor 8 and low-pass filter 10, 12. The applied square wave generates an electric field at the antenna 4. The capacitive load caused by the surrounding construction of the antenna 4 is typically approximately 50-500 pF.

The object of the adjustable resistor 8 is to adapt the square wave to the conditions given by the specific environment in order to establish a balanced working point at the output of voltage follower 20.

This balanced working point is used as a reference in comparisons with rapid variations of the electric field. Initially, the adjustable resistor 8 is set so that the working point at the output of the voltage follower 20 is equal to the reference voltage applied to the comparator 20 via the voltage divider 32, 34. The adjustable resistor 8 can also be realized as a digitally controlled resistor if the capacitive detector is realized in microprocessor architecture, which will be described in more detail below.

The low-pass filter 10, 12 is used to stabilize and balance the electric field generated of the antenna 4 and to prevent RF-signals from being fed into the electric circuit 2, which otherwise may cause disturbances. Optionally, an inductor (not shown) can be connected in series with resistor 10, if that is necessary to stabilize and balance the electric field at the antenna 4.

Operational amplifier 14, which at its negative input is fed with the square wave generated by square wave generator 6 and at its positive input is fed with the square wave affected by the capacitive load of the antenna 4, amplifies the difference thereof.

Operational amplifier 14 operates with an amplification of approximately 300,000, i.e. with an open loop amplification. This is necessary so as to detect small variations in the generated capacitive field. Operational amplifier 14 has among its parameters "Common Voltage Mode Range", CVMR. CVMR defines +/−working range which the input signal must be within in order to be amplified linearly. If the input signal is outside CVMR, the operational amplifier 14 will be blocked and the output will either be high of low. By balancing the variable high level of the generated square wave so that it exactly is kept within CVMR, unnecessary parts of the signal is blocked and, thus, only a small part of the square wave is amplified. This part has the highest sensibility with respect to capacitive influence. The capacitive influence on the signal of the antenna 4 has the characteristic charging and discharging curve. The differential measurement performed by operational amplifier 14 measures the difference between the uninfluenced square wave and the square wave influenced by the antenna capacitively. Since the values of the components of the electric circuit is very important so as to balance the operational amplifier 14 in an accurate way, they are listed in a separate component list following after the description.

High-pass filter 16 is used to filter DC components. This is performed so as to eliminate the effect of temperature and moisture variations, which may influence the accuracy of the capacitive measurement.

Voltage follower 20 is used to separate the detecting part of the circuits 2 from subsequent circuits. This is performed so as to limit the influence of the subsequent circuits on the top value rectifier 18.

Voltage follower 30 is also used to limit the influence of subsequent circuits thereof on the capacitor 38 and resistors 26 and 36.

Comparator 22 is used to stabilize and balance square wave generator 6. Voltage divider 32, 34 feeds comparator 22 with the reference voltage, which is to be compared with the output of voltage follower 20. The output of comparator 22 generates an inverted polarity compared with variations of the output of voltage follower 20. Capacitor 38 is arranged to prevent oscillation at comparator 22, i.e. the regulation will be dampened with a time constant R*C, where C is the value of capacitor 38 and R the value of resistor 36.

Comparator 24 is used to detect variations of the generated electric field at the antenna 4. These capacitive variations have a typical values of 2-10 pF when a human body enters the electric field. The positive input of comparator 24 is the output of voltage follower 20. During normal circumstances, i.e. when no variations of the electric field occur, this positive input corresponds to the reference voltage. The negative input of comparator 24 is fed from the output of voltage follower 30 via potential meter 42, which also corresponds to the reference voltage. Potential meter 42 is used to set the level at which the capacitive detector is to indicate that a change in the electric field has occurred, for example, when a person is closer the antenna 4 than a predetermined distance.

The described embodiment is constructed of analogous circuits, but of course it can also be realized in a microprocessor based architecture or other architectures by the man skilled in the art without departing from the scope of the invention.

Figure 2:
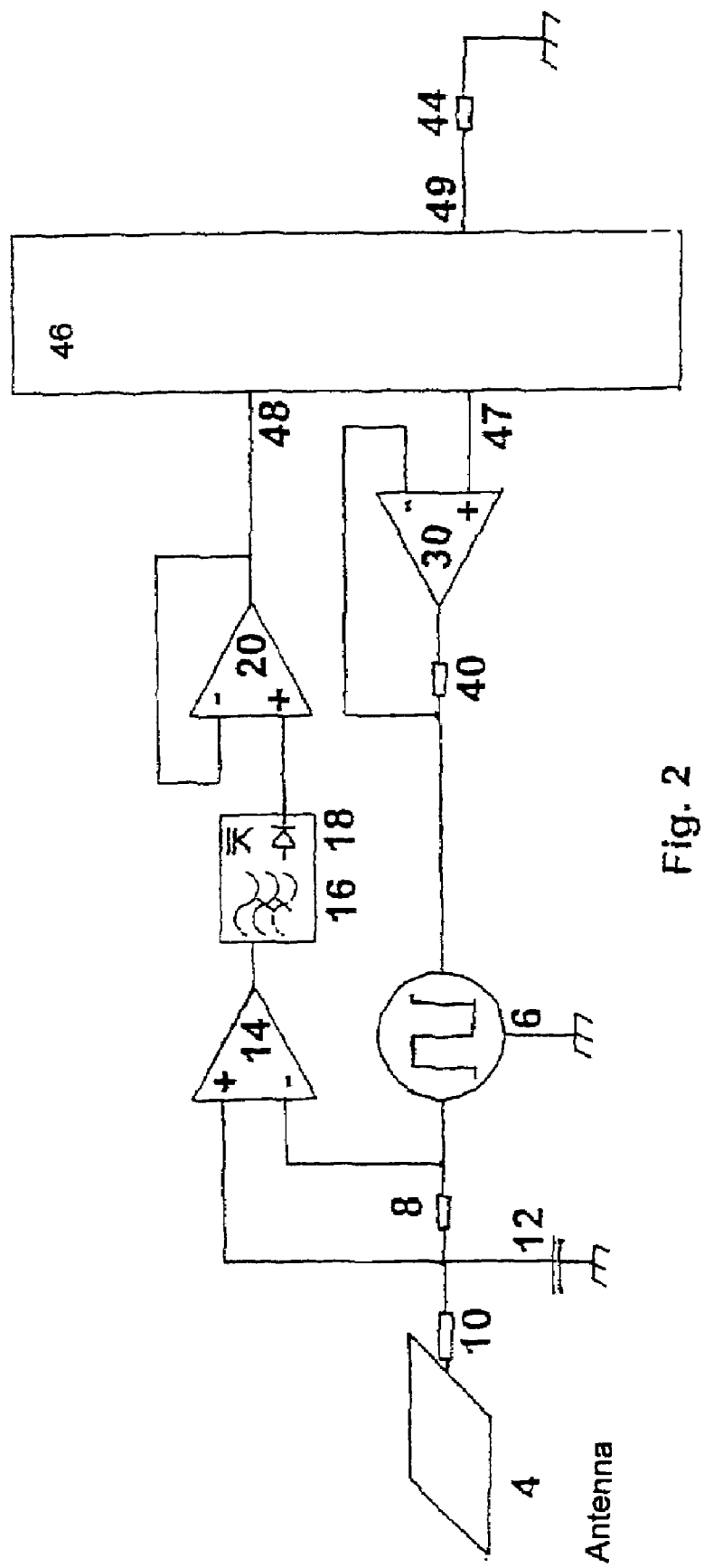
FIG. 2 is a circuit diagram according to second embodiment having a capacitive detector partly based on a microprocessor architecture.

FIG. 2 shows a second embodiment of the capacitive detector, which partly uses a microprocessor 46 based architecture, suitable for use in the present invention. It operates in a corresponding manner as the capacitive detector described with reference to FIG. 1 and will therefore not be described again. An advantage with this second embodiment is that the output indicating a change in the electric field at the antenna 4 can be divided in several different levels.

Figure 3:
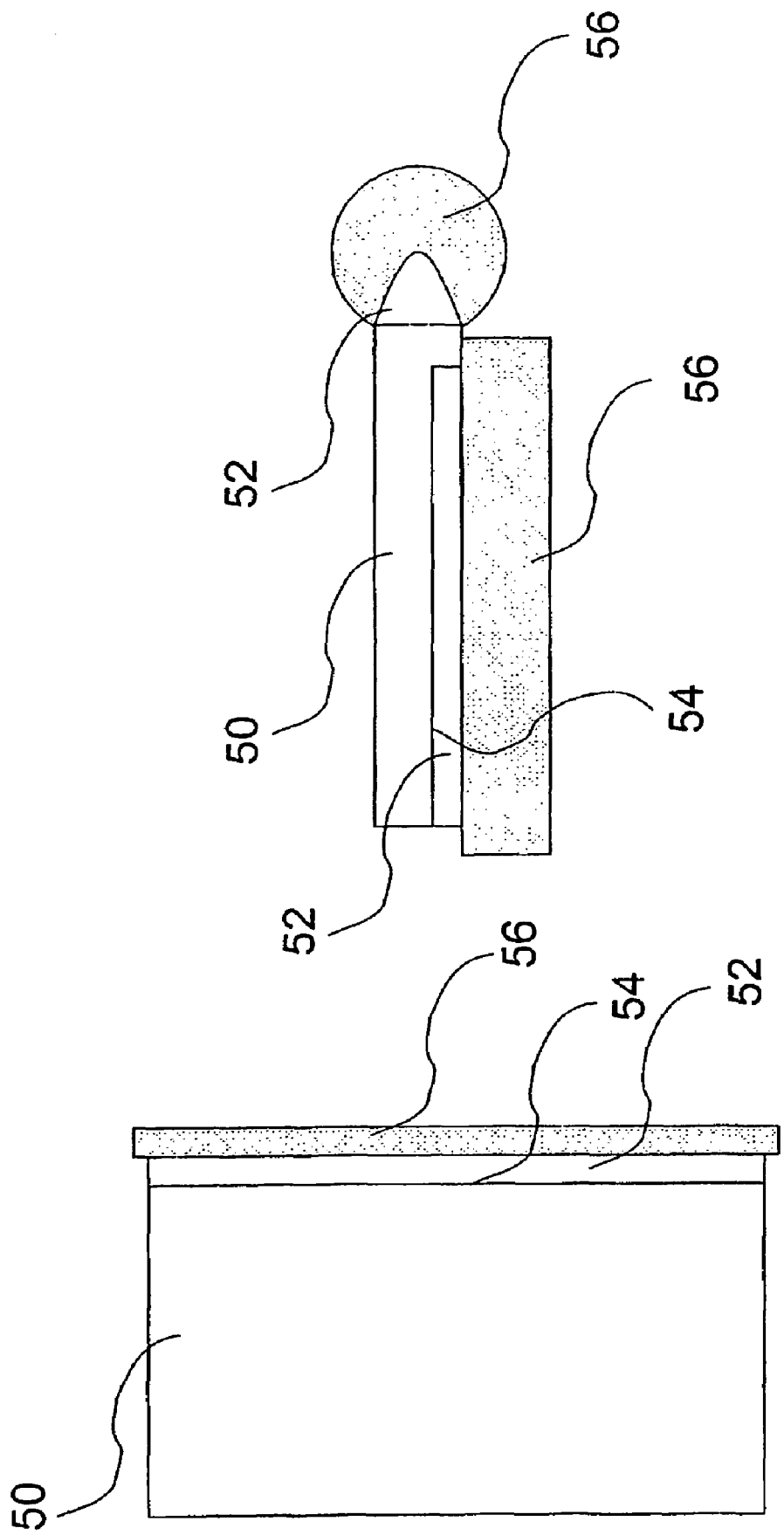
FIG. 3a is front view of a door provided with contact rails according to the present invention.
FIG. 3b is a top view of a door provided with contact rails according to the present invention.

With reference now to FIGS. 3a and 3b, the principle use of the invention in will be shown. In FIG. 3a a front view of an automatic door 50 having a contact rail 52 according to the invention arranged along the impact edge 54. The protection fields generated from the rails are indicated with the shaded field 56. In FIG. 3b a top view of an automatic door 50 having contact rail 52 arranged along the impact edge 54 and a contact rail arranged along the door blade. The protection fields generated from the rails are indicated with the shaded field 56. It should be noted that both FIG. 3a and FIG. 3b are schematic views and not according to scale.

Figure 4:
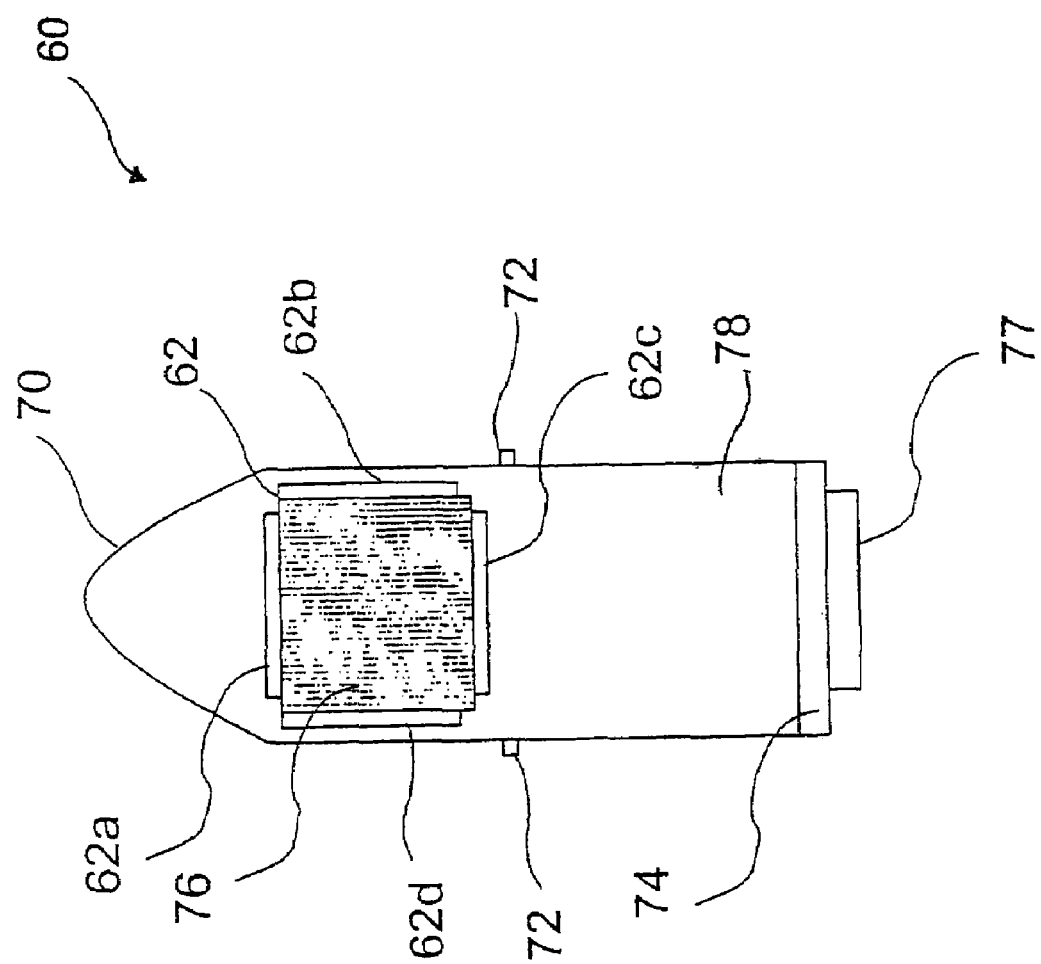
FIG. 4 shows a perspective view a first embodiment of a contact rail provided with a squeeze protecting device according to the present invention.
Figure 5:
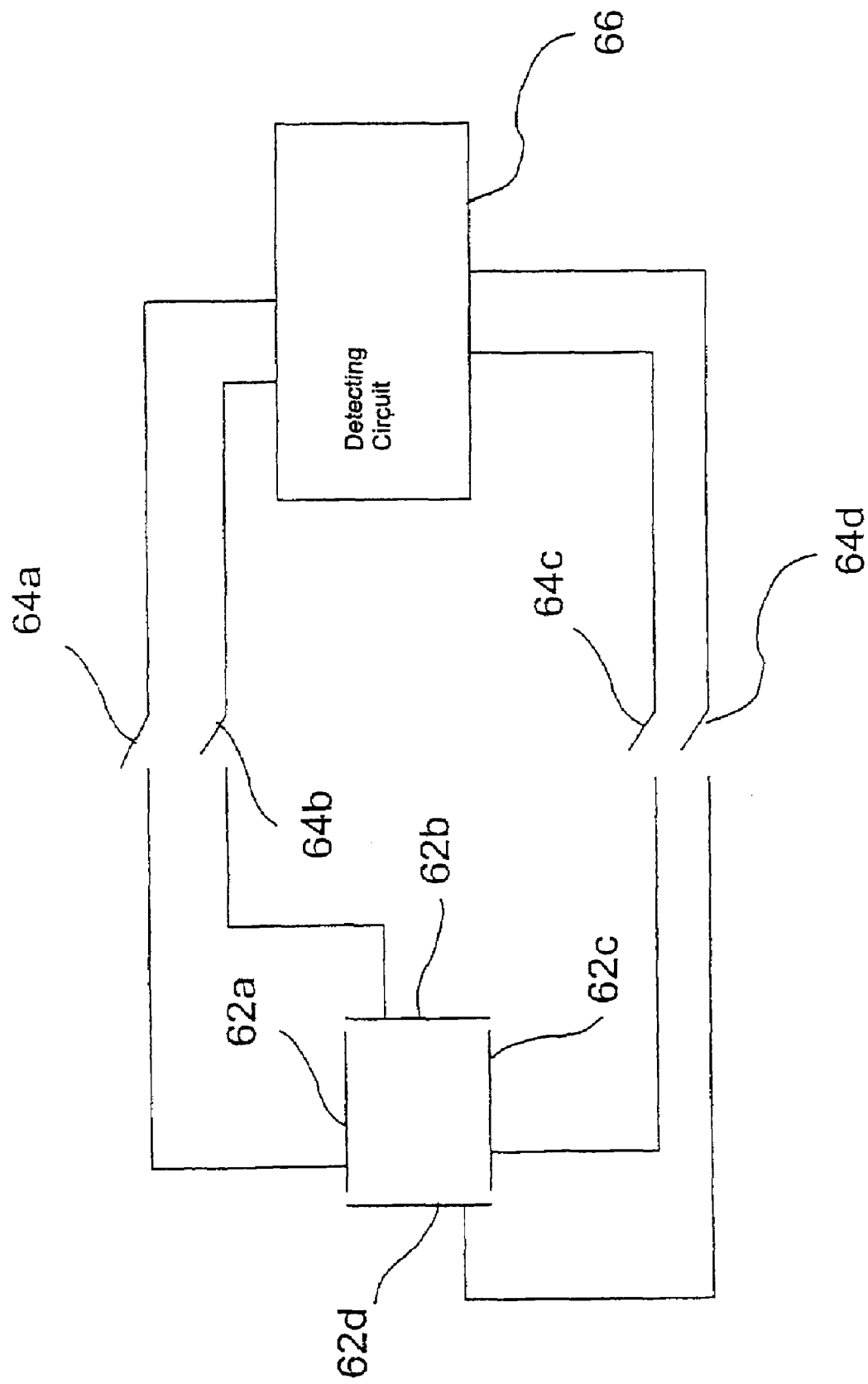
FIG. 5 shows the connection of the contact rail in FIG. 4 to a detecting circuit according to FIG. 1, 2, or 8.

In FIGS. 4 and 5, a first embodiment of the present invention is shown. This embodiment is a non-touch contact rail in the form of a non-conductive rubber profile provided with conductive conductors which constituting antennas for capacitive measurements. Of course, other material than conductive rubber may be used for the antennas.

The contact rail 60 includes an antenna unit 62, which in this embodiment comprises uniform antenna elements 62a, 62b, 62c, and 62d. The antenna elements is separated with a first isolating material 76, for example, foam. The antenna elements 62a, 62b, 62c, and 62d is arranged rectangular in pairs via a respective relay 64a, 64b, 64c, and 64d connected to a detecting circuit 66, see FIG. 5. For example, a detecting circuit of the type shown in FIG. 1 or FIG. 2 can be used. This construction makes it possible to select which of the antenna elements who will function as signal /measurement antenna by switching on the desired element by means of relays 64a, 64b, 64c, and 64d. Then, the other elements will function as screening elements or, alternatively, as grounding elements to amplify the variation at the measurement antenna.

Furthermore, the rail comprises a housing 70 of deformable rubber or plastic. The housing is filled with a second isolating material 78. To eliminate the risk that water running on the housing forms bridges to ground, flanges 72 are arranged in the housing in order to break possible water bridges. A conductive conductor 74 connected to the oscillator may preferably be arranged in the contact rail to stabilize the signal measurement environment. Due to the fact that the housing is entirely filled with isolating material the problem with condensation within the housing is avoided. Moreover, a fastening device 77 is arranged at the lower end of the rail for mounting at, for example, a door.

By selectively switching on or off one or more antennas is it possible to direct the interrogation or measurement field, see FIGS. 6a-6c. In FIGS. 6a-6c, a cross-section views of the rail according to the first embodiment are shown. In FIG. 6a, the element 62a is switched on and functions as a measurement antenna whereas the remaining elements that are switched off function as screening elements. The measurement field 68 will, in this case, be directed straight forward in relation to the location of the rail at the edge of the door or, in other words, with a angle of 90 degrees to the surface of the active element. In FIG. 6b, both element 62a and element 62b are switched on, whereas only element 62c and element 62d are switched off, and accordingly function as screening elements. Thereby, the measurement or protection field 68 will be directed obliquely forward in relation to the location of the rail at the door edge or with an angle of 45 degrees to the surface of element 62a and 62b. In FIG. 6c is only element 62b switched on and functions as a measurement antenna whereas the others are inactive. Thereby, it is possible to direct the measurement field obliquely in relation to the location of the rail at the edge of the door or with an angle of 90 to the surface of the active element 62b.

Thus, according to the embodiment of the present invention shown in FIGS. 4, 5 and 6a-6c comprising four conductive conductors or antenna elements 62a, 62b, 62c, and 62d, the conductors can function either as measurement antennas or as screen antennas, which makes it possible to direct the protection or measurement field in a desired direction. By means of the detector shown in FIG. 1 or 2 is possible to detect small capacitive variations in the generated field that surrounds the antenna (antennas), for example, if a person is moving in the area of the field.

Respective conductor pair, in this case 62a and 62c, 62b and 62d, respectively, form a capacitor in which the conductors function as capacitor plates. The dimensions of the conductors, the distance between the conductors of respective pair, the material of the conductors and the isolating material 76 determines the capacitance in F. The capacitance is changed when the distance between the conductors is changed, given fixed dimensions and materials. Changes of the distance are caused by a compressive of the rail by a compressive force, for example, when a person or an object comes into contact with the rail.

The rail according to the present invention is able to accordingly detect physical pressure from conductive as well as non-conductive object. Moreover, is able to detect persons or conductive objects within the measurement or protection area.

Of course, the construction of the conductors, the material, and the number of conductors can be varied. Consequently, in FIG. 7a, another embodiment of the rail in accordance with the present invention, in which two antenna units are used, is shown. The rail comprises a housing 80, which may, for example, consist of non-conductive rubber, filled with an isolating material 82. To eliminate the risk that water running on the housing forms bridges to ground, flanges 84 are arranged in the housing in order to break possible water bridges. Furthermore, an measurement antenna 86 arranged to, when it is switched on, generate a measurement field 88 for detecting conductive objects or persons. The antenna 86 is connected to a detecting circuit (e.g. of such type shown in FIG. 1, 2, or 8). A screen antenna 90 is arranged in parallel with the measurement antenna. According to an alternative embodiment, the screen antenna is replaced by a ground plane. If a screen antenna is used is it possible to perform measurements at longer distances since the coupling to ground is decreased.

The conductor pair, i.e. the measurement antenna 86 and the screen antenna 90, form a capacitor where the conductors function as capacitor plates. The dimensions of the conductors, the distance between the conductors of respective pair, the material of the conductors and the isolating material 82 determines the capacitance in F. The capacitance is changed when the distance between the conductors is changed, given fixed dimensions and materials. Changes of the distance are caused by a compressive of the rail by a compressive force, for example, when a person or an object comes into contact with the rail.

The smaller the distance between the conductors, the higher the sensitivity to compressive forces will become. By arranging notches at the housing, a more effective detecting of compressive forces are achieved, in a direction from the side as well as from straight ahead.

Figure 7B:
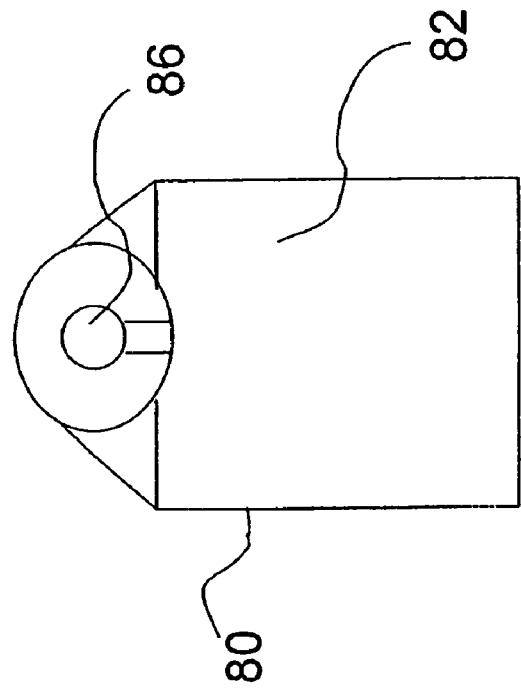
FIG. 7b shows in cross section a third embodiment of a contact rail provided with squeeze protection according to the present invention.
Figure 7A:
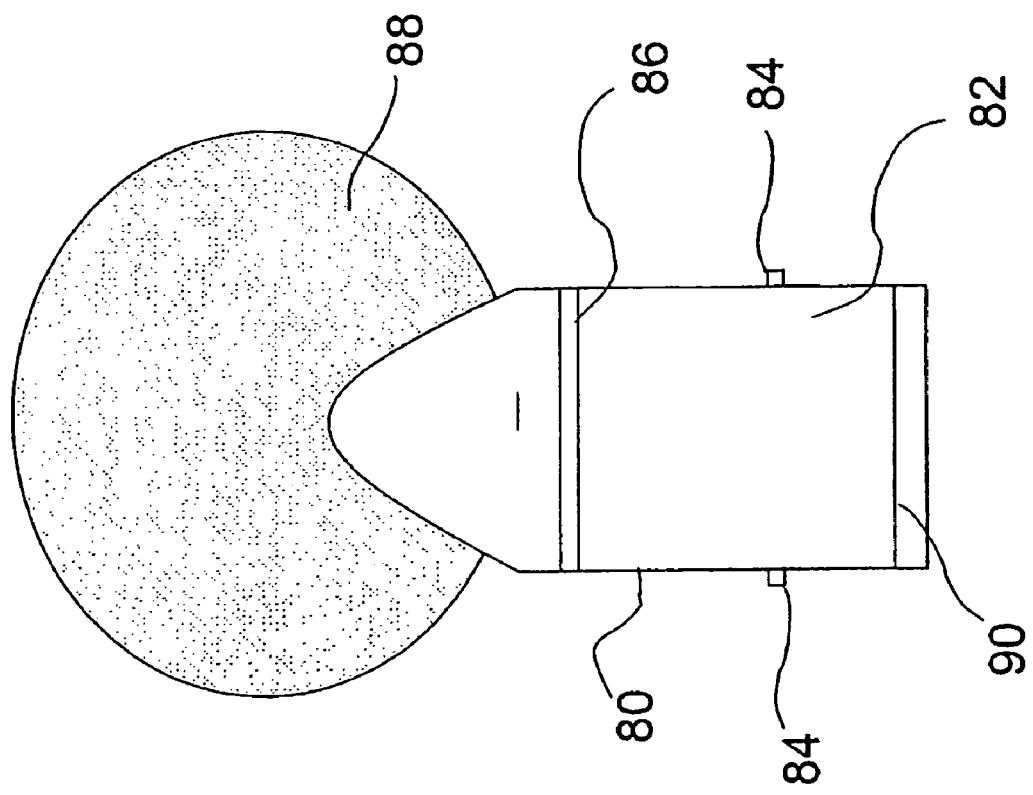
FIG. 7a shows in cross section a second embodiment of a contact rail provided with squeeze protection according to the present invention.

In FIG. 7b, a further embodiment having internal distance measurement and contacting capability, which enables a redundant system it is shown. The rail comprises a housing 80 of a conductive material, for example, a conductive rubber. In this embodiment, the housing 80 also functions as a ground plane. Furthermore, the rail comprises an antenna element 86 having circular cross section and an isolating material 82. Due to the circular construction of the antenna, a impact angle of 180 degrees or more is obtained. Since the housing is conductive, no external measurement field will be generated.

Figure 8:
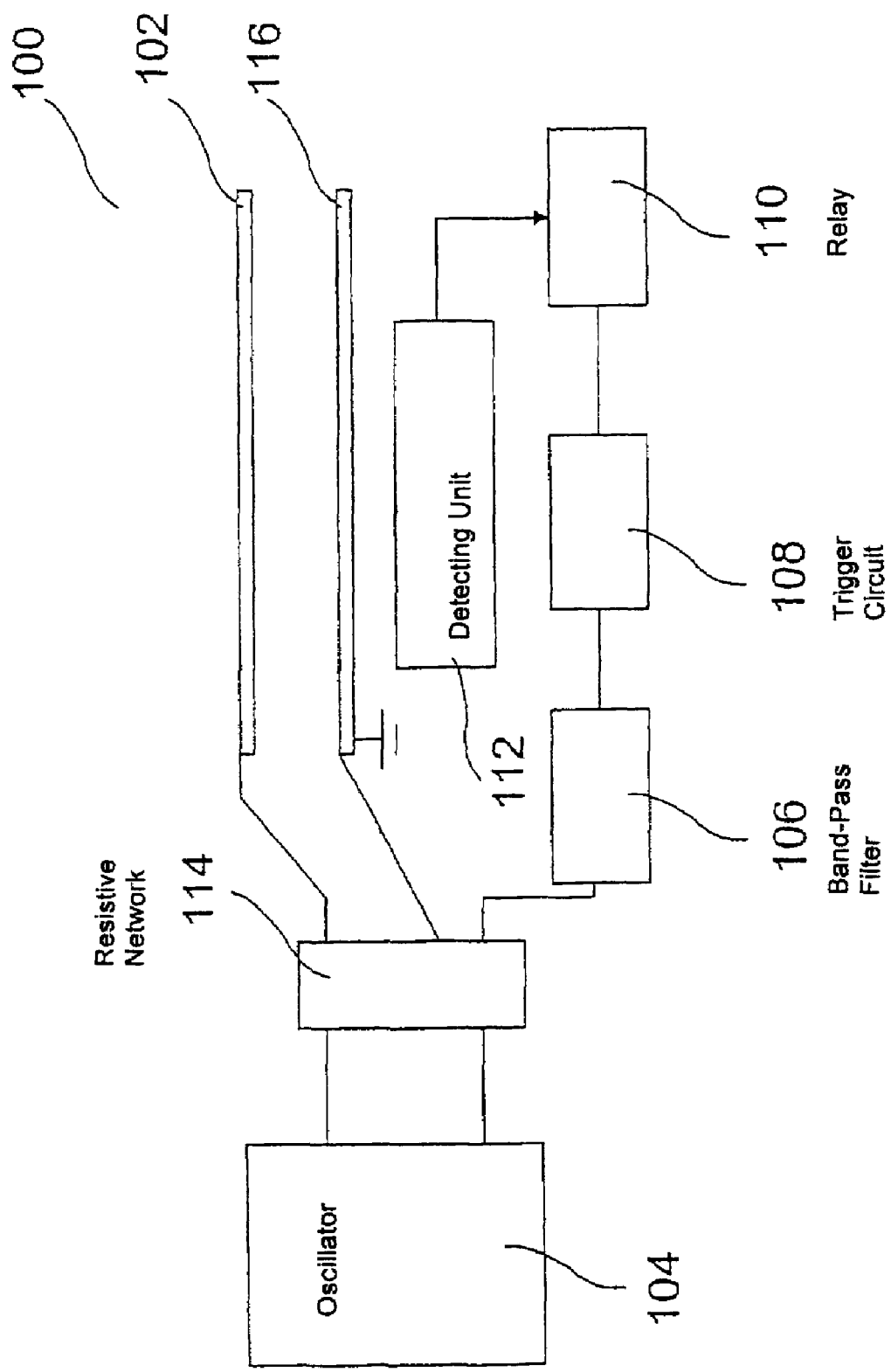
FIG. 8 shows a third embodiment of a circuit diagram having an analogous capacitive detecting circuit.

With reference now to FIG. 8, an additional detecting circuit 100, that can be used for detecting pressure against an antenna element as well as capacitive variations in a measurement field generated by an antenna element, is shown schematically. The circuit 100 may, for example, be connected to the rail shown in FIG. 7. The circuit comprises an oscillator 104 connected to a resistive network 114, a band-pass filter 106, a trigger circuit 108, a relay 110 and a detecting unit 112 for detecting a pressure against a measurement antenna 102 as a change of the distance between the measurement antenna 102 and a ground plane 116 (or a screen antenna). It should be noted that the circuit shown in FIG. 1 or 2 also can be used.

By switching on a screen antenna to a non-processed oscillator signal from the oscillator 104 in the resistive network 114, in combination with the measurement antenna 102, the following functions can be achieved.

1. The measurement field can be divided in action levels. For example, a first level may entail that the door slows down to half the original speed and a second level may trigger an emergency stop of the door or a reverse movement of the door.
2. The protection field may regulate the speed of the door so that it is adjusted in accordance with the walking speed of the pedestrian.
3. Further functions can be obtained by utilizing a physical compressive between the different conductors, which leads to significant results. For example, a contacting between the conductor of the measurement signal and ground may give rise to a positive indication whereas a contacting between the conductor of the non-processed oscillator signal and the measurement signal, respectively, may give rise to negative indication. In other cases the contacting between the conductors of ground and the non-processed oscillator signal, respectively, may be used.

With reference to FIGS. 9a-9f, further embodiments of the rail in accordance with the present invention are shown in cross section. I all of FIGS. 9a-9f, the same element is indicated with the same reference numeral according to the following table.

TABLE 1

| Element | Reference numeral |
|---|---|
| Measurement antenna | 120 |
| Screen antenna | 122 |
| Ground plane | 124 |
| Isolating material, e.g. foam | 126 |
| Housing | 128 |

The rail according to FIG. 9a has a housing 128 of a non-conducting material, for example, non-conductive rubber. Two screen antennas 122 is arranged within the housing 128 on either side of a measurement antenna 120. The rail shown in FIG. 9a detects both conductive persons and object in the measurement area as well as compressive forces. The compressive force can be measured as the degree of compressive.

Also the rail shown in FIG. 9b has a housing 128 of a non-conducting material, for example, non-conductive rubber. A screen antenna 122, a measurement antenna 120 and a ground plane 124 are arranged in the housing. The space between the screen antenna 122 and the measurement antenna 120 is filled with a isolating material 126, for example foam. The rail shown in FIG. 9b detects both conductive persons and object in the measurement area as well as compressive forces. The compressive force can be measured as the degree of compressive.

The rail shown in FIG. 9c has a housing 128 of a non-conducting material, for example, non-conductive rubber. A measurement antenna 120 and a ground plane 124 are arranged in the housing. The space between the ground plane 124 and the measurement antenna 120 is filled with a isolating material 126, for example foam. Since the rail according to FIG. 9c is completely filled, it is insensitive to condensation water. Moreover, it has a high durability for torsional forces. The rail shown in FIG. 9d has a housing 128 of a conducting material, which functions as a ground plane in conjunction with a ground plane 124 arranged inside the housing 128. Furthermore, a measurement antenna 120 is arranged on an element 126 of isolating material, for example, foam. The rail shown in FIG. 9d detects both conductive persons and object in the measurement area as well as compressive forces. The compressive force can be measured as the degree of compressive.

The rail shown in FIG. 9e has a housing 128, of which the upper part in the figure functions as a screen antenna 122 and the lower part functions as a ground plane 124. Furthermore, a measurement antenna 120 is arranged on an element 126 of isolating material, for example, foam. The rail shown in FIG. 9e detects both conductive persons and object in the measurement area as well as compressive forces. The compressive force can be measured as the degree of compressive.

The rail shown in FIG. 9f has a housing 128 of conductive material, which functions as a ground plane 124. Furthermore, a measurement antenna 120 and a screen antenna 122 are arranged on an element 126 of isolating material, for example, foam. The rail shown in FIG. 9f detects both conductive persons and object in the measurement area as well as compressive forces. The compressive force can be measured as the degree of compressive.

All of these rails can be used in the detecting circuits shown in FIGS. 1, 2, and 8.

In operation, the field generated at the rail will react when the door approaches the door post (ground plane), at mounting on double doors, it will react on the other door, since it is detected in the same way as a foreign object or a foreign person. To eliminate this, a synchronization may be performed by means of positioning sensor in the drive unit of the door, which at a given position will send a control instruction to the detecting circuit to perform the measurement at a smaller distance from the rail. Due to the fact that the speed of the door is decreased simultaneously, the stopping distance will be shorter for which reason the smaller field can adjusted to contact with the rubber edge. Thus, the extension of the measurement field is determined by the movement and speed of the door. Another solution is to always send a control signal to drive unit of the door, which instruct it to decrease the speed of the door at the end of the shutting movement and to simultaneously changing to a field having a smaller extension, change the direction of the measurement field (see FIGS. 6a-6c), or to block the field. A further method to prevent an undesired reaction at the door post is to mask the door post by either divide the measurement antenna and mount one part above the door post or to mount a conductor for the oscillator signal at the door post so that an appropriate part of the door is covered by an identical signal. Yet another method to prevent an undesired reaction at the door post is to arrange a separate non-contact contact rail with associated electronic (e.g. the detecting circuit, see FIG. 1, 2, or 8) at the door post and to synchronize the oscillators so that the signals are identical.

Even if the, at the present, preferred embodiments of the invention has been described, is it obvious for the man skilled within the art from the description that variations or adaptations of the present embodiments can be implemented without departing from the principles of the invention.

Thus, the intention that the invention is not to regarded as limited to only the structural or functional element described in the embodiments, but to the attached claims.

| List of components | |
|---|---|
| Reference numeral | Component (value) |
| 8 | 0-10 kΩ |
| 10 | 3,3 kΩ |
| 12 | 47 pF |
| 14 | ca 3160 E |
| 20 | TL 074 |
| 22 | LM 339 |
| 24 | LM 339 |
| 26 | L MΩ |
| 30 | TL 074 |
| 33 | 2,84 V |
| 36 | 1 MΩ |
| 38 | 100 μF |
| 40 | 200 Ω |

The invention claimed is:

1. Squeeze protecting device arranged to detect the presence of an object in a protection area comprising a housing and an antenna unit connected to a detecting circuit, which circuit is arranged to, via said antenna unit, detect capacitive variations in an electric- or electro-magnetic field at said antenna unit, characterised in that said detecting circuit comprises
   a signal generator that provides a signal to the antenna unit that generates the electric or electro-magnetic field at the antenna unit;
   balancing means for maintaining the generated electric or electromagnetic field at the antenna unit in a balanced condition;
   filter means for preventing the detecting circuit from being affected by variations in temperature and moisture; and
   detecting means for detecting small variations in the generated electric or electromagnetic field at the antenna unit and/or a variation of pressure at said antenna unit caused by a compressive force applied to said housing,
   wherein the presence of conductive as well as non-conductive objects in said protection area can be detected.

2. Squeeze protecting device according to claim 1, characterised by that said antenna unit comprises a plurality of conductive elements connected to said detecting circuit.

3. Squeeze protecting device according to claim 1, wherein the detecting circuit detects the compressive force as a variation of the capacitance between a first conductive element and a second element of the antenna unit.

4. Squeeze protecting device arranged to detect the presence of an object in a protection field comprising a housing and an antenna unit connected to a detecting circuit, which circuit is arranged to, via said antenna unit, detect capacitive variations in an electric- or electro-magnetic field at said antenna unit, characterised in that said antenna unit comprises a plurality of conductive elements connected to said detecting circuit, wherein the detection circuit comprises:
   a signal generator that provides a signal to the antenna unit that generates the electric or electro-magnetic field at the antenna unit;
   balancing means for maintaining the generated electric or electromagnetic field at the antenna unit in a balanced condition;
   filter means for preventing the detecting circuit from being affected by variations in temperature and moisture; and
   detecting means for detecting small variations in the generated electric or electromagnetic field at the antenna unit and/or detecting a compressive force applied at said housing as a variation of the distance between a first conductive element and a second conductive element of the plurality of conductive elements,
   wherein the presence of conductive as well as non-conductive objects in said protection field can be detected.

5. Squeeze protecting device according to claim 4, characterised in that each of said conductive elements of said antenna unit is connected to said detecting circuit via a relay, wherein said electric or electromagnetic field can be directed in a desired direction by switching on or off, respectively, suitable conductive elements of the antenna unit.

6. Squeeze protecting device according to claim 1 or 4, wherein the detecting circuit detects the compressive force as a variation of the capacitance at said antenna unit.

7. Squeeze protecting device according to claim 1 or 4, characterised in that said housing comprises a first isolating material and that said antenna unit comprises a second isolating material.

8. Squeeze protecting device according to claim 1 or 4, characterised in that said antenna unit has a circular cross section.

9. Squeeze protecting device according to claim 1 or 4, characterised in that masking means is arranged at a grounded object located adjacent to said squeeze protecting device, wherein a detection of said grounded object as a conductive object is avoided.

10. Squeeze protecting device according to claim 9, characterised in that said masking means comprises a conductor connected to said detecting circuit arranged on the grounded object located adjacent to said squeeze protecting device, wherein the detection of said grounded object as the conductive object is avoided.

11. Squeeze protecting device according to claim 9, characterised in that said masking means comprises a conductive element connected to said antenna unit mounted at the grounded object located adjacent to said squeeze protecting device, wherein the detection of said grounded object as the conductive object is avoided.

12. A contact rail provided with the squeeze protecting device according to claim 1 or 4.

13. Method for, at a squeeze protecting device arranged at a door, detecting the presence of an object in a protection field, which squeeze protecting device comprises a housing and an antenna unit connected to a detecting circuit, comprising the step of, via said antenna unit, detecting capacitive variations in an electric or electromagnetic field at said antenna unit, characterised by the steps of:
   detecting a variation of the pressure at said antenna unit caused by a compressive force applied to said housing,
   generating an electric or electromagnetic field at the antenna unit;
   maintaining the generated electric or electromagnetic field at the antenna unit in a balanced condition;
   preventing the detecting circuit from being affected by variations in temperature and moisture;
   detecting small variations in the generated electric or electromagnetic field at the antenna unit; and
   indicating that a variation in the electric or electromagnetic field at the antenna unit has occurred,
   wherein the presence of conductive as well as non-conductive objects in said protection field can be detected.

14. Method according to claim 13, characterised by the step of detecting the compressive force applied to said housing as a variation of the distance between a first and a second conductive element of said antenna unit.

15. Method for, at a squeeze protecting device arranged at a door, detecting the presence of an object in a protection field, which squeeze protecting device comprises a housing and an antenna unit connected to a detecting circuit, comprising the step of, via said antenna unit, detecting capacitive variations in an electric or electromagnetic field at said antenna unit, characterised by the steps of:
- detecting a variation of the distance between a first and a second conductive element of said antenna unit;
- generating an electric or electromagnetic field at the antenna unit;
- maintaining the generated electric or electromagnetic field at the antenna unit in a balanced condition;
- preventing the detecting circuit from being affected by variations in temperature and moisture;
- detecting small variations in the generated electric or electromagnetic field at the antenna unit; and
- indicating that a variation in the electric or electromagnetic field at the antenna unit has occurred,
- wherein the presence of conductive as well as non-conductive objects in said protection field can be detected.

16. Method according to claim 13 or 15, characterised by the step of directing said electric or electromagnetic field in a desired direction by switching on or off, respectively, suitable conductive elements.

17. Method according to claim 13 or 15, characterised by the step of masking a grounded object located adjacent to said squeeze protecting device, wherein a detection of said grounded object as a conductive object is avoided.

18. Method according to claim 17, characterised in that said step of masking comprises the step of arranging a conductor connected to said detecting circuit on the grounded object located adjacent to said squeeze protecting device, wherein the detection of said grounded object as the conductive object is avoided.

19. Method according to claim 17, characterised in that said step of masking comprises the step of mounting a conductive element connected to said antenna unit at the grounded object located adjacent to said squeeze protecting device, wherein the detection of said grounded object as the conductive object is avoided.

20. System for detecting the presence of an object in a protection field, comprising a contact rail for mounting at an automatic door and a detecting circuit connected to an antenna unit arranged in said rail, which circuit is arranged to, via said antenna unit, detect capacitive variations in an electric- or electro-magnetic field at said antenna unit, characterised in that said detecting circuit comprises:
- a signal generator that provides a signal to the antenna unit that generates the electric or electro-magnetic field at the antenna unit;
- balancing means for maintaining the generated electric or electromagnetic field at the antenna unit in a balanced condition;
- filter means for preventing the detecting circuit from being affected by variations in temperature and moisture; and
- detecting means for detecting small variations in the generated electric or electromagnetic field at the antenna unit and/or a variation of pressure at said antenna unit caused by a compressive force against said rail,
- wherein the presence of conductive as well as non-conductive objects in said protection field can be detected.

21. System for detecting the presence of an object in a protection field comprising a contact rail for mounting at an automatic door and a detecting circuit connected to an antenna unit arranged in said rail, which circuit is arranged to, via said antenna unit, detect capacitive variations in an electric- or electro-magnetic field at said antenna unit, characterised in that said antenna unit comprises a plurality of conductive elements connected to said detecting circuit and that said detecting circuit comprises:
- a signal generator that provides a signal to the antenna unit that generates the electric or electro-magnetic field at the antenna unit;
- balancing means for maintaining the generated electric or electromagnetic field at the antenna unit in a balanced condition;
- filter means for preventing the detecting circuit from being affected by variations in temperature and moisture; and
- detecting means for detecting small variations in the generated electric or electromagnetic field at the antenna unit and/or detecting a compressive force applied at said rail as a variation of the distance between a first conductive element and a second conductive element of the plurality of conductive elements,
- wherein the presence of conductive as well as non-conductive objects in said protection field can be detected.

22. System for detecting the presence of an object in a protection field according to claim 20 or 21, comprising another contact rail that is mounted on a grounded object located adjacent to said automatic door and that includes another detecting means, wherein the detecting means and said another detecting means are synchronized in order to provide identical signals such that a detection of said grounded object as a conductive object is avoided.

* * * * *